(12) United States Patent
Zhang

(10) Patent No.: US 9,274,178 B2
(45) Date of Patent: Mar. 1, 2016

(54) APPARATUS AND METHOD FOR DETECTING BATTERY ABNORMALITY AND CAUSE THEREOF

(71) Applicant: O2 Micro Inc., Santa Clara, CA (US)

(72) Inventor: Wei Zhang, Shanghai (CN)

(73) Assignee: O2 MICRO INC., Santa Clara, CA (US)

( * ) Notice: Subject to any disclaimer, the term of this patent is extended or adjusted under 35 U.S.C. 154(b) by 520 days.

(21) Appl. No.: 13/785,684

(22) Filed: Mar. 5, 2013

(65) Prior Publication Data

US 2013/0245970 A1    Sep. 19, 2013

(30) Foreign Application Priority Data

Mar. 15, 2012 (CN) .......................... 2012 1 0068838

(51) Int. Cl.
*G01R 31/00* (2006.01)
*G01R 31/36* (2006.01)
*G01R 31/04* (2006.01)

(52) U.S. Cl.
CPC ........ *G01R 31/3627* (2013.01); *G01R 31/3662* (2013.01); *G01R 31/04* (2013.01)

(58) Field of Classification Search
CPC ............. G01R 31/026; G01R 31/3651; G01R 31/3679; H01M 10/425; H01M 2/30; H01M 10/125; H01M 4/14; H02J 7/0014; H02J 7/0045; H02J 7/0052; H02J 7/0068; H02J 7/0072
See application file for complete search history.

(56) References Cited

U.S. PATENT DOCUMENTS

| 4,411,969 | A | * | 10/1983 | Sundberg | ................ | H01M 4/14 429/228 |
| 8,332,342 | B1 | * | 12/2012 | Saha | .................. | G01R 31/3651 706/45 |
| 8,446,127 | B2 | * | 5/2013 | Yazami | ............... | H01M 10/443 320/132 |

* cited by examiner

*Primary Examiner* — Elias Desta
(74) *Attorney, Agent, or Firm* — Pillsbury Winthrop Shaw Pittman LLP

(57) ABSTRACT

Methods and apparatus for detecting abnormality of a battery pack are disclosed. The battery pack includes multiple battery cells coupled in series via at least one connecting wire. A first voltage drop between a positive electrode and a negative electrode of the battery pack is detected. A first set of voltage drops between a positive electrode and a negative electrode of each battery cell in the battery pack is also detected. A total voltage drop across the at least one connecting wire in the battery pack is calculated based on an absolute difference between the first voltage drop and a sum of the first set of voltage drops. Whether the battery pack is abnormal is determined by assessing the total voltage drop across the at least one connecting wire with respect to a predetermined threshold.

13 Claims, 10 Drawing Sheets

APPARATUS AND METHOD FOR DETECTING BATTERY ABNORMALITY AND CAUSE THEREOF

RELATED APPLICATIONS

This application claims priority to Chinese Patent Application No. 201210068838.5, filed on Mar. 15, 2012 with the State Intellectual Property Office of the People's Republic of China, incorporated by reference in its entirety herein.

FIELD OF THE PRESENT TEACHING

The present teaching relates generally to a field of battery technology, and more specifically to an apparatus and a method for detecting battery abnormality and cause thereof.

BACKGROUND

Battery packs are commonly used for supplying power in electric vehicles. With a development of new energy industry, electric vehicles have become popular. An electric vehicle can catch fire when there is an abnormal electrical connection in a battery pack in the electric vehicle. Thus it is important to detect connection status of connecting wires in a battery pack to avoid inflammation of an electric vehicle, or any device including the battery pack. However, because connecting wires are inside the battery pack which is usually installed inside an electric vehicle, it is not convenient for a user to open the battery pack to directly check the connection status of connecting wires. Therefore, there exists a need of a method for detecting abnormality of a battery pack without opening the battery pack.

SUMMARY

The embodiments described herein relate to methods and apparatus for detecting battery abnormality and cause thereof.

In an embodiment, a method for detecting abnormality of a battery pack is disclosed. The battery pack includes multiple battery cells coupled in series via at least one connecting wire. A first voltage drop between a positive electrode and a negative electrode of the battery pack is detected. A first set of voltage drops between a positive electrode and a negative electrode of each battery cell in the battery pack is also detected. A total voltage drop across the at least one connecting wire in the battery pack is calculated based on an absolute difference between the first voltage drop and a sum of the first set of voltage drops. Whether the battery pack is abnormal is determined by assessing the total voltage drop across the at least one connecting wire with respect to a predetermined threshold.

In another embodiment, a method for detecting abnormality of a battery pack is disclosed. The battery pack includes multiple battery cells coupled in series via at least one connecting wire. A first voltage drop between an electrode of a first battery cell and a corresponding electrode of a second battery cell is detected when the battery pack is neither in a charging period nor in a discharging period. The first battery cell and the second battery cell are adjacent to each other in the battery pack. A second voltage drop between the electrode of the first battery cell and the corresponding electrode of the second battery cell is detected during the charging or discharging period of the battery pack. A first resistance of a connecting wire connecting the first battery cell and the second battery cell is calculated based on the first voltage drop, the second voltage drop and a current flowing through the battery pack during the charging or discharging period. Whether the connection between the first and second battery cells is abnormal is determined based on the first resistance of the connecting wire.

In still another embodiment, an apparatus for detecting abnormality of a battery pack is disclosed. The battery pack has multiple battery cells coupled in series via at least one connecting wire. The apparatus includes a voltage detecting module, a computing module and a determining module. The voltage detecting module is configured for detecting a first voltage drop between a positive electrode and a negative electrode of the battery pack and for detecting a first set of voltage drops between a positive electrode and a negative electrode of each battery cell in the battery pack. The computing module is configured for calculating a total voltage drop across the at least one connecting wire in the battery pack based on an absolute difference between the first voltage drop and a sum of the first set of voltage drops. The determining module is configured for determining that whether the battery pack is abnormal by assessing the total voltage drop across the at least one connecting wire with respect to a predetermined threshold.

In yet another embodiment, an apparatus for detecting abnormality of a battery pack is disclosed. The battery pack has multiple battery cells coupled in series via at least one connecting wire. The apparatus includes a voltage detecting module, a computing module and a determining module. The voltage detecting module is configured for detecting a first voltage drop between an electrode of a first battery cell and a corresponding electrode of a second battery cell when the battery pack is neither in a charging period nor in a discharging period. The voltage detecting module is also configured for detecting a second voltage drop between the electrode of the first battery cell and the corresponding electrode of the second battery cell during the charging or discharging period of the battery pack. The first battery cell and the second battery cell are adjacent to each other in the battery pack. The computing module is configured for calculating a first resistance of a connecting wire connecting the first and second battery cells based on the first voltage drop, the second voltage drop and a current flowing through the battery pack during the charging or discharging period. The determining module is configured for determining whether the connection between the first and second battery cells is abnormal based on the first resistance of the connecting wire.

Additional benefits and novel features will be set forth in part in the description which follows, and in part will become apparent to those skilled in the art upon examination of the following and the accompanying drawings or may be learned by production or operation of the disclosed embodiments. The benefits of the present embodiments may be realized and attained by practice or use of various aspects of the methodologies, instrumentalities and combinations set forth in the detailed description set forth below.

BRIEF DESCRIPTION OF THE DRAWINGS

Features and benefits of embodiments of the claimed subject matter will become apparent as the following detailed description proceeds, and upon reference to the drawings, wherein like numerals depict like parts. These exemplary embodiments are described in detail with reference to the drawings. These embodiments are non-limiting exemplary embodiments, in which like reference numerals represent similar structures throughout the several views of the drawings.

DETAILED DESCRIPTION

Reference will now be made in detail to the embodiments of the present teaching. While the present teaching will be described in conjunction with these embodiments, it will be understood that they are not intended to limit the present teaching to these embodiments. On the contrary, the present teaching is intended to cover alternatives, modifications and equivalents, which may be included within the spirit and scope of the present teaching as defined by the appended claims.

Furthermore, in the following detailed description of the present teaching, numerous specific details are set forth in order to provide a thorough understanding of the present teaching. However, it will be recognized by one of ordinary skill in the art that the present teaching may be practiced without these specific details. In other instances, well known methods, procedures, components, and circuits have not been described in detail as not to unnecessarily obscure aspects of the present teaching.

An electric vehicle can catch fire when there is a loose connection in a battery pack in the electric vehicle. A connecting wire with high resistance may be a main heat resource which increases the temperature of the battery pack and accelerates aging of an insulating layer of the connecting wire and even ignites inflammable materials in the electric vehicle. Taking a 64V, 20 Ah battery pack as an example, TABLE 1 shows characteristics of a connecting wire at a normal connection and at a loose connection. As shown in TABLE 1, during both discharging period and charging period, an resistance of the connecting wire increases greatly due to a loose connection, which leads to an increased heating power and correspondingly increased temperature of the battery pack. Methods and apparatus are disclosed in present teaching for detecting a loose connection or other abnormalities that may cause an increased temperature of a battery pack. In addition, various embodiments of present teaching disclosed below provide a convenient solution for detecting battery abnormality without the need to open the battery pack.

TABLE 1

| | | Discharging period | Charging period |
|---|---|---|---|
| Wire Resistance | Normal Connection | 10 mΩ | |
| | Loose Connection | 200 mΩ | |
| Current | | 8 A | 3 A |
| Heating Power | Normal Connection | 0.64 W | 0.09 W |
| | Loose Connection | 12.8 W | 1.8 W |

Figure 1:
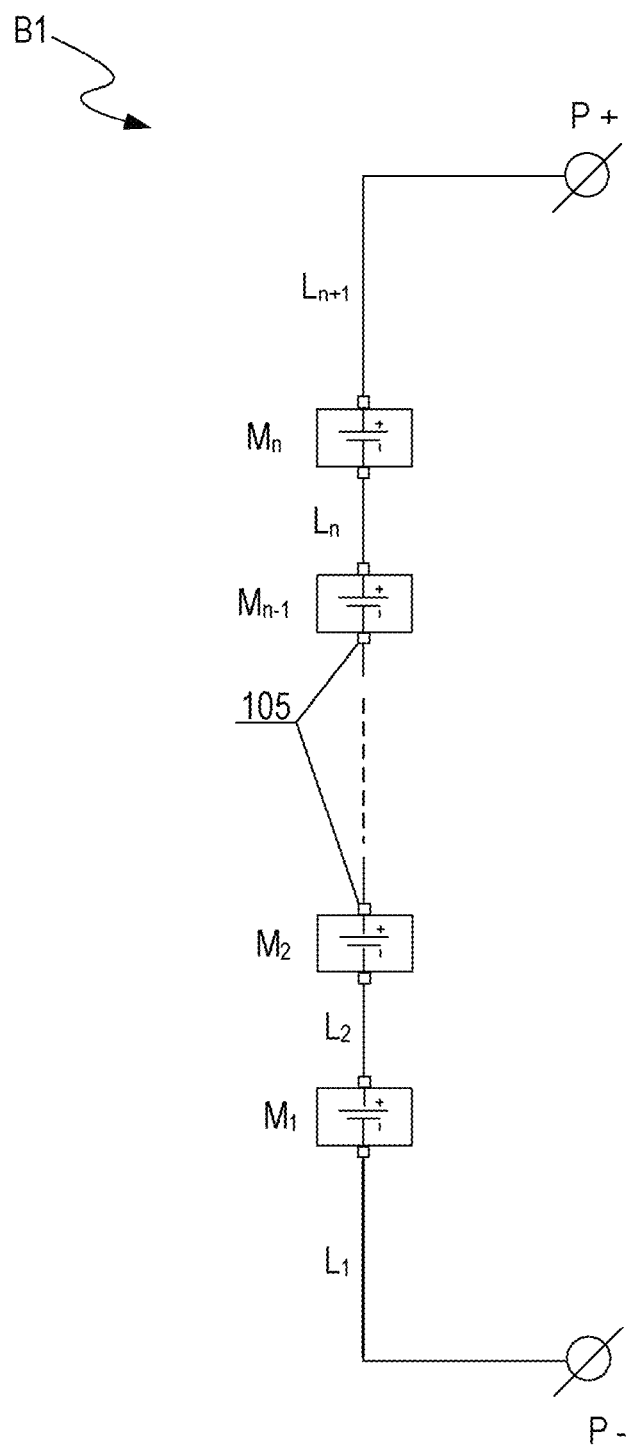
FIG. 1 illustrates an example of a structure of a battery pack, in accordance with an embodiment of the present teaching.

FIG. 1 illustrates an example of a structure of a battery pack B1, in accordance with an embodiment of the present teaching.

The battery pack B1 may be located in a light electric vehicle (LEV) or any other devices which need power. The battery pack B1 may include multiple battery cells $M_1$, $M_2 \ldots M_n$ coupled in series, where n may be an integer greater than or equal to 2. As shown in FIG. 1, $L_1$ denotes a connecting wire between a negative electrode of the battery cell $M_1$ and a negative electrode P– of the battery pack B1; $L_{n+1}$ denotes a connecting wire between a positive electrode of the battery cell $M_n$ and a positive electrode P+ of the battery pack B1; and $L_i$ denotes a connecting wire between a positive electrode of the battery cell $M_{i-1}$ and a negative electrode of the battery $M_i$, where i=2 . . . n. Each connecting wire may attach to an electrode of one of the multiple battery cells $M_1$, $M_2 \ldots M_n$ by a connector 105.

Figure 2:
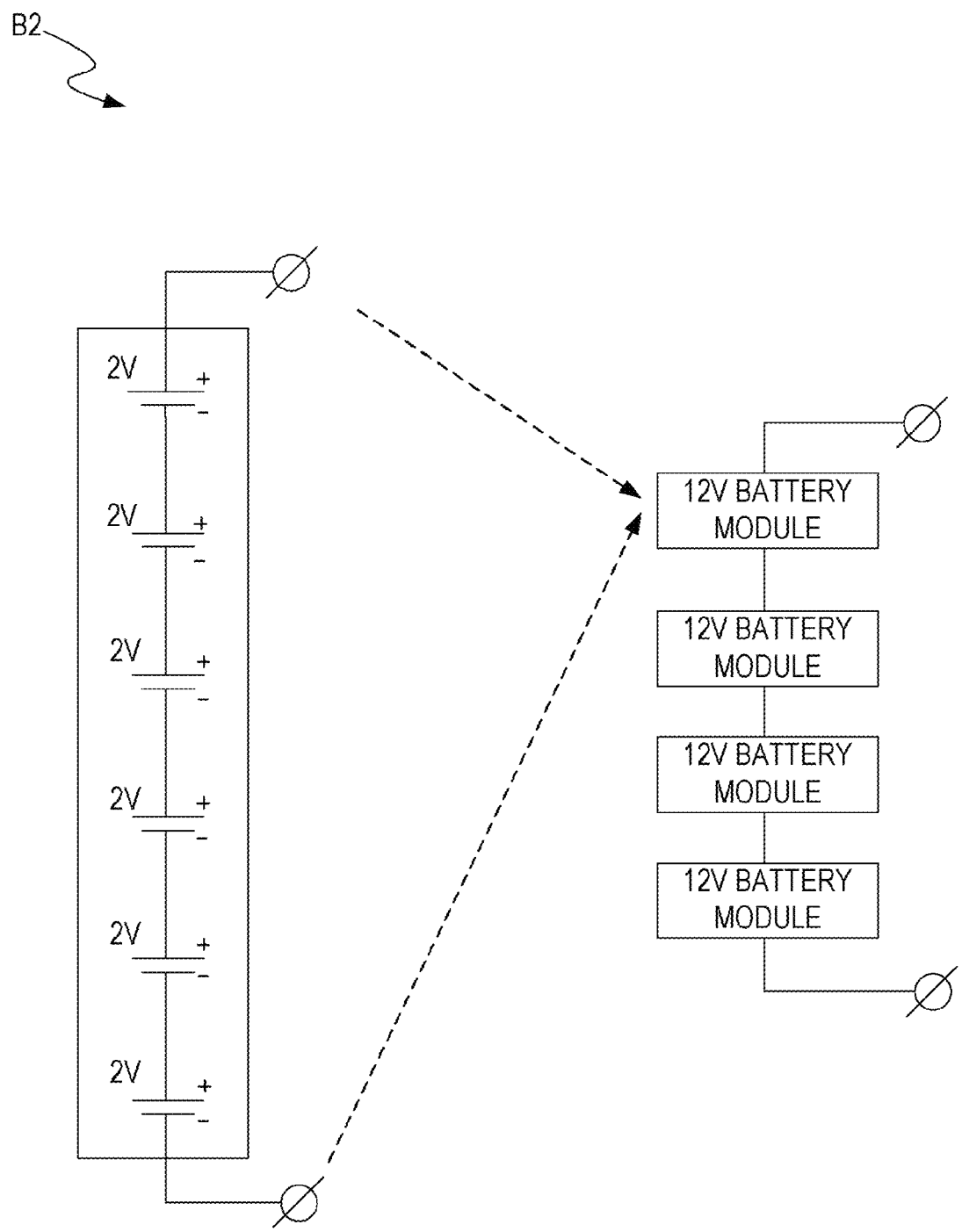
FIG. 2 illustrates another example of a structure of a battery pack, in accordance with an embodiment of the present teaching.

FIG. 2 illustrates another example of a structure of a battery pack B2, in accordance with an embodiment of the present teaching.

The battery pack B2 may be in an LEV or any other devices which need power. The battery pack B2 may include four battery modules coupled in series. Each battery module may have a nominal voltage of 12V. Each battery module in this embodiment includes six battery cells coupled in series. Each battery cell may have a nominal voltage of 2V.

An actual voltage of a battery module in the battery pack B2 may be larger than 12V, due to an abnormality of the battery module. The abnormality may be a loose connection of a connecting wire in the battery module, or a sharp increase of an resistance of one battery cell in the battery module.

Figure 3:
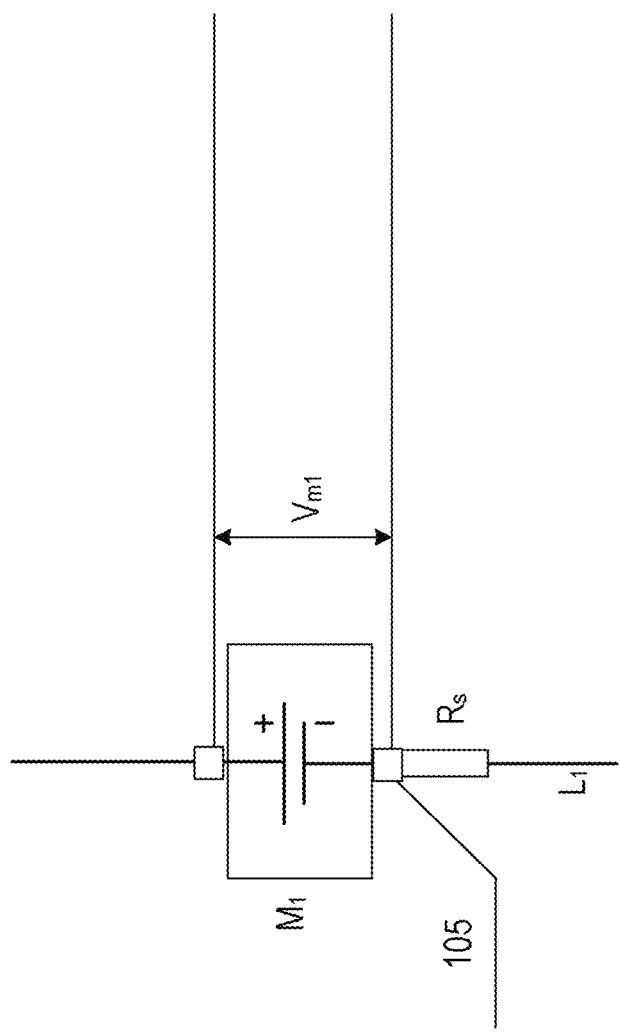
FIG. 3 illustrates a battery cell in an exemplary battery pack, in accordance with an embodiment of the present teaching.

FIG. 3 illustrates a battery cell $M_1$ in a battery pack, in accordance with an embodiment of the present teaching. For example, the battery pack may be battery pack B1, as shown in FIG. 1.

During a charging period, because each connecting wire has an intrinsic resistance, there may be a voltage drop across each connecting wire. For example, if intrinsic resistance $R_{L1}$ of connecting wire $L_1$ is 30 mΩ, a voltage drop $V_{L1}$ can be calculated by equation (1) represented as:

$$V_{L1} = I_{chg} \times R_{L1} \quad (1)$$

The $I_{chg}$ denotes a charging current flowing through the battery pack B1.

A total voltage drop $V_L$ of all connecting wires in the battery pack B1 can be calculated by equation (2) represented as:

$$V_L = \sum_{i=1}^{n+1} V_{Li} = I_{chg} \times \sum_{i=1}^{n+1} R_{Li} \quad (2)$$

The $R_{Li}$ denotes an intrinsic resistance of connecting wire $L_i$. The $V_{Li}$ denotes a voltage drop across the connecting wire $L_i$.

A voltage drop $V_P$ between the positive electrode P+ and the negative electrode P− of the battery pack B1 can be calculated by equation (3) represented as:

$$V_P = \sum_{i=1}^{n} V_{mi} + \sum_{i=1}^{n+1} V_{Li} = \sum_{i=1}^{n} V_{mi} + I_{chg} \times \sum_{i=1}^{n+1} R_{Li} \quad (3)$$

If all connections between each battery cell and its corresponding connected wires are normal, the total voltage drop $V_L$ across connecting wires may be much smaller than the voltage drop $V_P$, because an intrinsic resistance of a connecting wire is usually much smaller than a resistance of a battery cell.

Similarly, during a discharging period, voltage drop $V_{L1}$ of connecting wire L1 can be calculated by equation (4) represented as:

$$V_{L1} = I_{dsg} \times R_{L1} \quad (4)$$

The $I_{dsg}$ denotes a discharging current flowing through the battery pack B1.

A total voltage drop $V_L$ of all connecting wires in the battery pack B1 can be calculated by equation (5) represented as:

$$V_L = \sum_{i=1}^{n+1} V_{Li} = I_{dsg} \times \sum_{i=1}^{n+1} R_{Li} \quad (5)$$

A voltage drop $V_P$ between the positive electrode P+ and the negative electrode P− of the battery pack B1 can be calculated by equation (6) represented as:

$$V_P = \sum_{i=1}^{n} V_{mi} - \sum_{i=1}^{n+1} V_{Li} = \sum_{i=1}^{n} V_{mi} - I_{dsg} \times \sum_{i=1}^{n+1} R_{Li} \quad (6)$$

As described above, the total voltage drop $V_L$ across connecting wires may have a relatively small value if all connections between each battery cell and its corresponding connected wires are normal. However, if any one of the connectors, for example connection 105 between a connecting wire and a battery cell is loose, a new resistance $R_S$ may be generated at the connector 105. Then the total voltage drop $V_L$ may increase to a large value.

For example, during a charging period, if a connector 105 between a connecting wire and a battery cell is loose, the voltage drop $V_P$ between the positive electrode P+ and the negative electrode P− of the battery pack B1 can be calculated by equation (7) as:

$$V_P = \sum_{i=1}^{n} V_{mi} + \sum_{i=1}^{n+1} V_{Li} + I_{chg} \times R_S \quad (7)$$

The total voltage drop across all connecting wires can be calculated by equation (8) represented as:

$$V_L = \left| V_P - \sum_{i=1}^{n} V_{mi} \right| = \sum_{i=1}^{n+1} V_{Li} + I_{chg} \times R_S \quad (8)$$

Similarly, during a discharging period, the voltage drop $V_P$ between the positive electrode P+ and the negative electrode P− of the battery pack B1 can be calculated by equation (9) represented as:

$$V_P = \sum_{i=1}^{n} V_{mi} - \sum_{i=1}^{n+1} V_{Li} - I_{dsg} \times R_S \quad (9)$$

The total voltage drop $V_L$ of all connecting wires can be calculated by equation (10) represented as:

$$V_L = \left| V_P - \sum_{i=1}^{n} V_{mi} \right| = \sum_{i=1}^{n+1} V_{Li} + I_{dsg} \times R_S \quad (10)$$

Because the resistance $R_S$ caused by the loose connection may have a relatively high value (e.g., greater than 200 mΩ), the total voltage drop $V_L$ across connecting wires may become high correspondingly. For example, if the charging/discharging current is 2.5 A, due to the loose connection, the total voltage drop $V_L$ across connecting wires will increase by 0.5V (200 mΩ×2.5 A). If the charging/discharging current is 30 A, due to the loose connection, the total voltage drop $V_L$ across connecting wires will increase by 6V (200 mΩ×30 A).

The methods and apparatus disclosed in accordance with various embodiments of present teaching can detect not only loose connections in a battery pack, but also any abnormalities of the battery pack that may cause the total voltage drop across connecting wires to be larger than a predetermined threshold.

Figure 4:
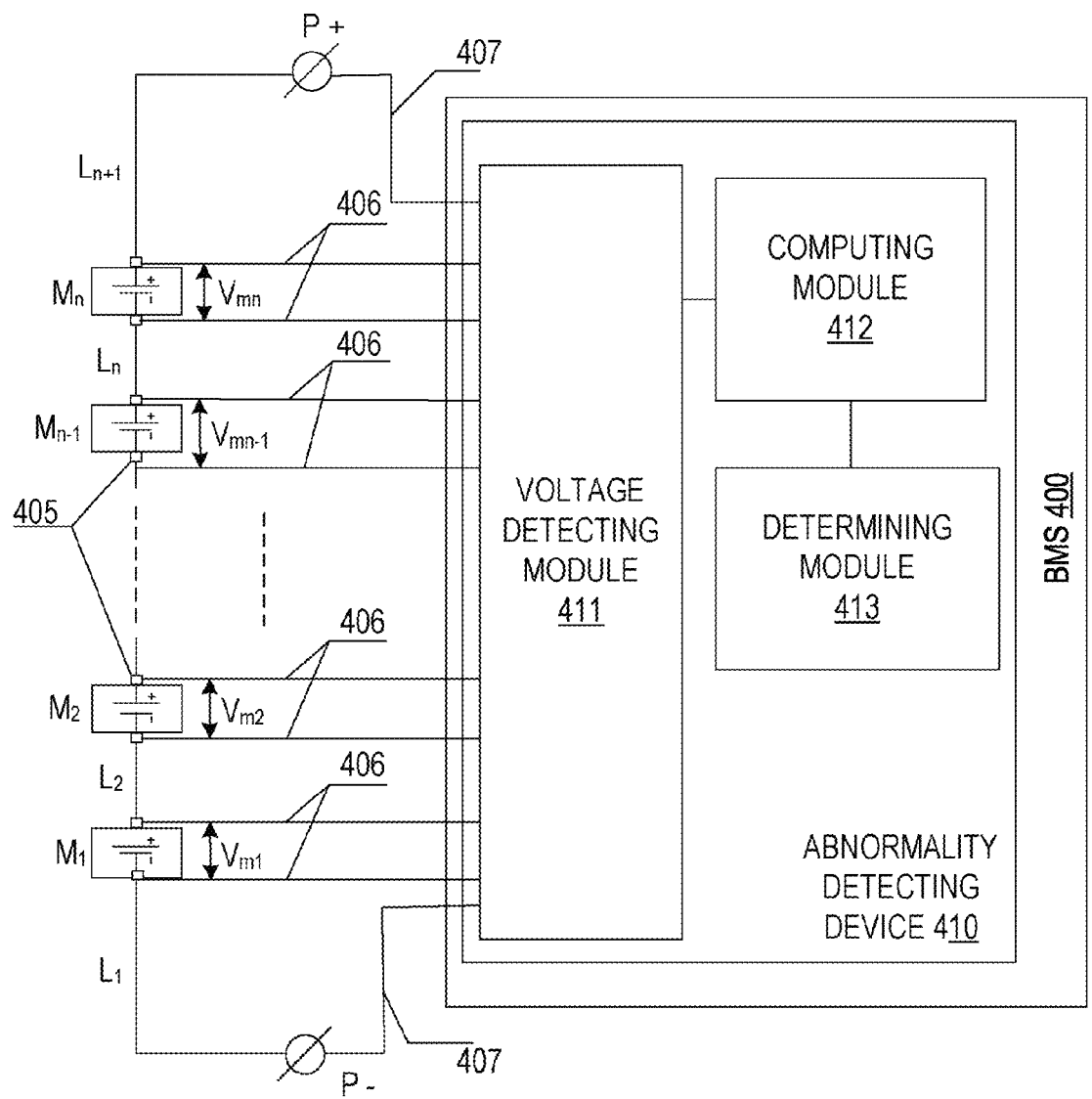
FIG. 4 is a block diagram illustrating an exemplary battery management system (BMS), in accordance with an embodiment of the present teaching.

FIG. 4 is a block diagram illustrating an exemplary battery management system (BMS) 400, in accordance with an embodiment of the present teaching.

The BMS 400 may include the battery pack B1 in FIG. 1 and an abnormality detecting device 410. The abnormality detecting device 410 may be an apparatus including a voltage detecting module 411, a computing module 412 and a determining module 413. The apparatus 410 may have at least one processor, storage, and a communication platform. The modules 411, 412, and 413 may all be implemented on the processor. The storage may store thresholds for detecting abnormality of the battery pack. The system 400 may communicate with other systems in e.g., an electric vehicle, via the communication platform.

The voltage detecting module 411 may be coupled to the positive electrode P+ and the negative electrode P− of the battery pack B1 through two detecting wires 407 respectively and may be configured for detecting a first voltage drop $V_P$ between the positive electrode P+ and the negative electrode P− of the battery pack B1. In addition, the voltage detecting module 411 may be coupled to each positive electrode and each negative electrode of each battery cell in the battery pack B1 through two detecting wires 406 and may be configured for detecting a first set of voltage drops between a positive electrode and a negative electrode of each battery cell in the battery pack B1.

The computing module 412 may be configured for calculating a total voltage drop $V_L$ across all connecting wires in the battery pack B1 based on an absolute difference between the first voltage drop $V_P$ and a sum of the first set of voltage drops.

The determining module 413 may be configured for determining whether the battery pack B1 is abnormal, e.g., whether a connection between a battery cell and a connecting wire is loose.

The abnormality detecting device 410 may further include a warning module (not shown in FIG. 4). The warning module may generate a warning signal indicating that an electrical connection in the battery pack B1 is abnormal.

In accordance with one embodiment, during a discharging period or a charging period of the battery pack B1, the voltage detecting module 411 detects a voltage $V_P$, on the positive electrode P+ of the battery pack B1 and a voltage $V_{P-}$ on the negative electrode P− of the battery pack B1 and calculates the voltage drop $V_P$ between the positive electrode P+ and the negative electrode P− by equation (11) represented as:

$$V_P = V_{P+} - V_{P-} \tag{11}$$

The voltage detecting module 411 may also detect a voltage on a positive electrode and a negative electrode of each battery cell in the battery pack B1 and calculate the first set of voltage drops between the positive electrode and the negative electrode of each battery cell. Taking battery cell $M_i$ ($1 \leq i \leq n$) as an example, the battery detecting module 411 may detect a voltage $V_{mi+}$ on a positive electrode of the battery cell $M_i$ and a voltage $V_{mi-}$ on a negative electrode of the battery cell $M_i$ and calculate a voltage drop $V_{mi}$ among the first set of voltage drops by equation (12) represented as:

$$V_{mi} = V_{mi+} - V_{mi-} \tag{12}$$

The computing module 412 may calculate a total voltage drop $V_L$ across all connecting wires $L_1, L_2 \ldots L_{n+1}$ based on an absolute value of a difference between the voltage drop $V_P$ and a sum of the first set of voltage drops by equation (13) represented as:

$$V_L = \left| V_P - \sum_{i=1}^{n} V_{mi} \right| \tag{13}$$

The determining module 413 may determine whether any one of connectors 405 between each two adjacent battery cells is loose based on the total voltage drop $V_L$. For example, the determining module 413 may compare the total voltage drop $V_L$ with a predetermined threshold $V_{TH}$ to determine whether the electrical connection of the battery pack is abnormal. If the total voltage drop $V_L$ is greater than the predetermined threshold $V_{TH}$, the determining module 413 can determine that the electrical connection of the battery pack B1 is abnormal. The predetermined threshold $V_{TH}$ can be determined based on an empirical value. Alternatively, the predetermined threshold $V_{TH}$ can be determined by means described below.

For example, when the battery pack B1 is neither in the charging period or in the discharging period, the voltage detecting module 411 may detect a second voltage drop $V_{Sp}$ between the positive electrode P+ and the negative electrode P− of the battery pack B1 and a second set of voltage drops $V_{Smi}$ between the positive electrode and the negative electrode of each battery cell $M_i$ ($1 \leq i \leq n$). The computing module 412 may calculate a detecting error $\Delta V$ based on an absolute value of a difference between the second voltage drop $V_{Sp}$ and a sum of the second set of voltage drop $V_{Smi}$ by equation (14) represented as:

$$\Delta V = \left| V_{SP} - \sum_{i=1}^{n} V_{Smi} \right| \tag{14}$$

When the battery pack is neither in the charging period or discharging period, the detecting error $\Delta V$ may be relatively small, e.g., less than 100 mv. The predetermined threshold $V_{TH}$ can be set with a value which is greater than the detecting error $\Delta V$. For example, the predetermined threshold $V_{TH}$ may be greater than ten times of the detecting error $\Delta V$.

In order to improve accuracy, multiple predetermined thresholds can be set corresponding to different currents flowing through the battery pack B1. During a discharging period or a charging period, if a current $I_1$ flows through the battery pack B1 and if the abnormality detecting device 410 determines that all electrical connections of the battery pack B1 are normal based on the predetermined threshold $V_{TH}$, the abnormality detecting device 410 may update the value of the predetermined threshold $V_{TH}$ to a new value. The new value can be greater than (e.g., at least 1.5 times of) the absolute difference between the first voltage drop $V_P$ and the sum of the first set of voltage drops which have been measured during the discharging period or the charging period associated with the current $I_1$. During a discharging period or a charging period, if a current $I_2$ flows through the battery pack B1 and if the abnormality detecting device 410 determines that all electrical connections of the battery pack B1 are normal based on the predetermined threshold $V_{TH}$, the abnormality detecting device 410 may update the value of the predetermined threshold $V_{TH}$ to a new value. The new value can be greater than (e.g., at least 1.5 times of) the absolute difference between the first voltage drop $V_P$ and the sum of the first set of voltage drops which have been measured during the discharging period or the charging period associated with the current $I_2$. Then the abnormality detecting device 410 may establish a relationship table between different currents (e.g., $I_1$, $I_2$) and different thresholds (e.g., $V_{TH1}$, $V_{TH2}$) for later comparison. Thus different predetermine thresholds may be used corresponding to different charging/discharging currents.

The accuracy can be further improved by detecting the first voltage drop $V_P$ and the sum of the first set of voltage drops for multiple times during the charging period or the discharging period to calculate multiple absolute differences between the first voltage drop $V_P$ and the sum of the first set of voltage drops, and determining the predetermined threshold $V_{TH}$ based on an average of the multiple absolute differences.

Figure 5:
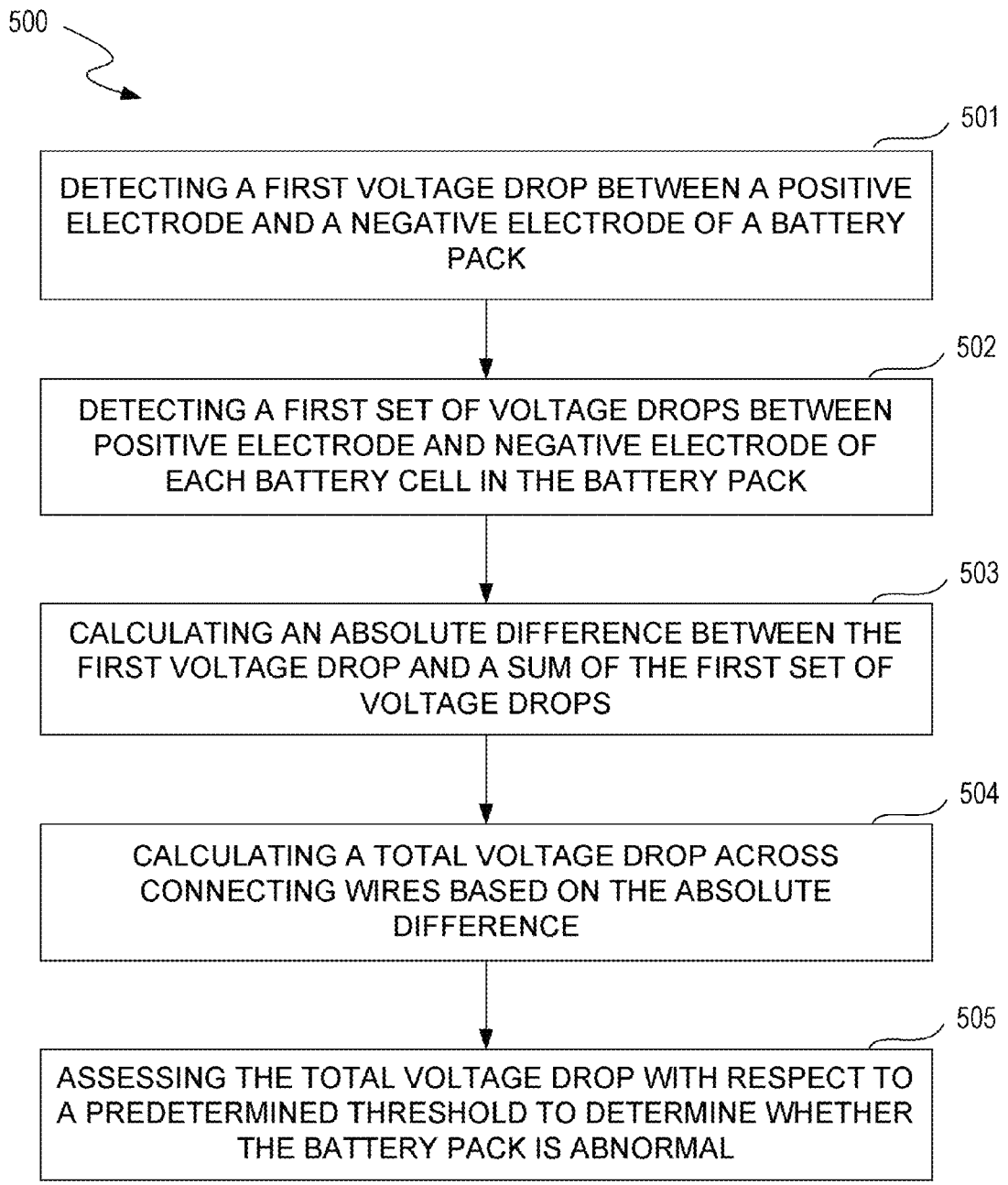
FIG. 5 is a flowchart illustrating an exemplary embodiment of a method for detecting abnormality of a battery pack, in accordance with an embodiment of the present teaching.

FIG. 5 is a flowchart 500 illustrating a method for detecting abnormality of a battery pack, in according with an embodiment of the present teaching. The method may be implemented on a machine having at least one processor, storage, and a communication platform. For example, FIG. 5 may be described in combination with FIG. 4, for detecting abnormality of the battery pack B1.

At 501, a first voltage drop $V_P$ between a positive electrode P+ and a negative electrode P− of the battery pack B1 may be detected. As described above, this may be performed by the voltage detecting module 411 during a discharging period or a charging period of the battery pack B1.

At 502, a first set of voltage drops between a positive electrode and a negative electrode of each battery cell in the battery pack B1 may be detected. For example, the voltage detecting module 411 may detect a voltage drop $V_{mi}$ between a positive electrode of a battery cell Mi ($1 \leq i \leq n$) and a negative electrode of the battery cell $M_i$.

At 503, an absolute value of a difference between the first voltage drop $V_P$ and a sum of the first set of voltage drops may be calculated by an equation:

$$\left| V_P - \sum_{i=1}^{n} V_{mi} \right|.$$

At 504, a total voltage drop $V_L$ across the connecting wires $L_1, L_2 \ldots L_{n+1}$ may be calculated based on the absolute value. For example, $V_L$ may be equal to the absolute value or be a function of the absolute value.

At 505, the total voltage drop $V_L$ may be assessed with respect to a predetermined threshold $V_{TH}$ to determine whether the battery pack B1 is abnormal. For example, if the total voltage drop $V_L$ across the connecting wires is greater than the predetermined threshold $V_{TH}$, the determining module 413 may determine that an electrical connection of the battery pack is abnormal.

In one embodiment, the threshold $V_{TH}$ can be determined according to the following steps. When the battery pack B1 is neither in the charging period nor in the discharging period, the voltage detecting module 411 may detect a second voltage drop $Vs_P$ between the positive electrode P+ and the negative electrode P− of the battery pack B1 and a second set of voltage drops between the positive electrode and the negative electrode of each battery cell in the battery pack B1. For example, the voltage detecting module 411 may detect a voltage drop $V_{Smi}$ between the positive electrode of the battery cell $M_i$ ($1 \leq i \leq n$) and the negative electrode of the battery cell $M_i$ when the battery pack B1 is neither in the charging period nor in the discharging period.

The computing module 412 may calculate an absolute value of a difference between the second voltage drop $Vs_P$ and a sum of the second set of voltage drops to calculate a detecting error $\Delta V$ using the equation:

$$\Delta V = \left| V_{Sp} - \sum_{i=1}^{n} V_{Smi} \right|.$$

In one embodiment, the computing module 412 may determine the predetermined threshold $V_{TH}$ in a value which is greater than ten times of the detecting error $\Delta V$. Then the determining module 413 may compare the total voltage drop $V_L$ with the predetermined threshold $V_{TH}$ to determine whether the electrical connection of the battery pack is abnormal.

During a discharging period or a charging period of the battery pack B1, if a current I flows through the battery pack B1 and if the determining module 413 determines that the electrical connection of the battery pack B1 is normal, the computing module 412 may update the predetermined threshold $V_{TH}$ to a new value. The new value can be greater than (e.g., at least 1.5 times of) the absolute value of the difference between the first voltage drop $V_P$ and the sum of the first set of voltage drops which are measured during the discharging period or the charging period associated with the current I. Thus, a relationship table is established between an updated predetermined threshold $V_{TH}$ and the current I for later comparison.

In order to determine which battery cell in a battery pack is abnormal, and minimize the amount of detecting wires needed, the voltage detecting module in an abnormality detecting device may detect a voltage drop between one electrode of a first battery cell and a corresponding electrode of an adjacent battery cell. For example, following embodiments will be disclosed.

Figure 6:
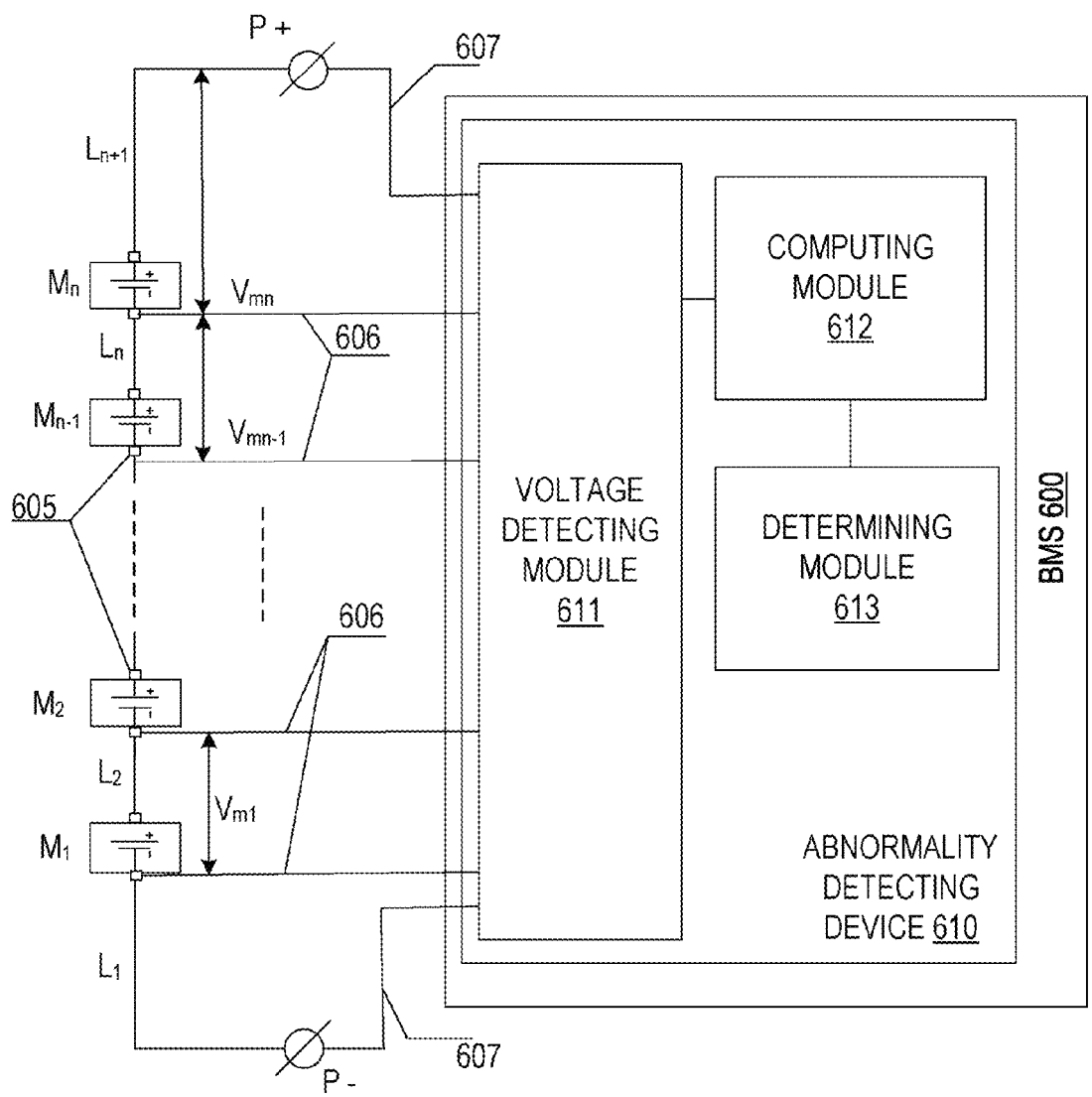
FIG. 6 is a block diagram illustrating an exemplary BMS, in accordance with another embodiment of the present teaching.

FIG. 6 is a block diagram illustrating an exemplary BMS 600, in accordance with another embodiment of the present teaching.

The BMS 600 may include the battery pack B1 in the FIG. 1 and an abnormality detecting device 610. The abnormality detecting device 610 may include a voltage detecting module 611, a computing module 612 and a determining module 613. The apparatus 610 may have at least one processor, storage, and a communication platform. The modules 611, 612, and 613 may all be implemented on the processor. The storage may store thresholds for detecting abnormality of the battery pack. The system 600 may communicate with other systems in e.g., an electric vehicle, via the communication platform.

The voltage detecting module 611 may be coupled to the positive electrode P+ and the negative electrode P− of the battery pack B1 through two detecting wires 607 respectively. Moreover, the voltage detecting 611 may be coupled to each negative electrode of the battery cells $M_1, M_2 \ldots M_n$ through n detecting wires 606. The voltage detecting module 611 may be configured for detecting a first voltage drop $V_{Smi-}$ between a negative electrode of a first battery cell $M_i$ ($1 \leq i \leq n$) in the battery pack B1 and a corresponding negative electrode of a second battery cell $M_{i+1}$ in the battery pack B1 when the battery pack B1 is neither in a charging period nor in a discharging period. The second battery cell $M_{i+1}$ may be an adjacent battery cell of the battery cell $M_i$. In addition, during the charging period or the discharging period of the battery pack B1, the voltage detecting module 611 may be further configured for detecting a second voltage drop $V_{mi-}$ between the negative electrode of the first battery cell $M_i$ and the corresponding negative electrode of the second battery cell $M_{i+1}$.

In one embodiment, the second voltage drop $V_{mi-}$ may be an average value of multiple voltage drops detected within a predetermined time period which starts from a beginning of the charging period or the discharging period. Alternatively, the second voltage drop $V_{mi-}$ can be an instantaneous value within this predetermined time period. For example, the predetermined time period can be 3 s~6 s or 1 s~5 s.

For example, during the charging period or the discharging period, a current I may flow through the battery pack B1. The computing module 612 may be configured for calculating a resistance $R_i$ of a connecting wire between the first battery cell $M_i$ and the second battery cell $M_{i+1}$ based on the first voltage drop $V_{Smi-}$, the second voltage drop $V_{mi-}$ and the current I using equation (15) represented as:

$$R_i = |V_{mi-} - V_{Smi-}|/I \qquad (15)$$

The current I may be greater than 5 A for electric bicycles, and may be greater than 20 A for electric vehicles.

The determining module 613 may be configured for determining whether an connection between the first battery cell $M_i$ and its adjacent battery cell $M_{i+1}$ is abnormal based on the resistance $R_i$ of the connecting wire.

If the connection between $M_i$ and $M_{i+1}$ is normal, the connector 605 between $M_i$ and $M_{i+1}$ may be determined to be in a normally connected status. In such case, the voltage drop between the negative electrode of the first battery cell $M_i$ and the negative electrode of the second battery cell $M_{i+1}$ increases slowly during the charging period or decreases slowly during the discharging period. However, if the connection $M_i$ and $M_{i+1}$ is abnormal, the connector 605 $M_i$ and $M_{i+1}$ may be in a loosely connected status. During the charging period or the discharging period, a significant change in the voltage drop between the negative electrode of the first battery cell $M_i$ and the negative electrode of the second battery cell $M_{i+1}$ may happen because of a new resistance $R_s$ generated by the loose connection of the connector 605. Thus, by detecting the voltage drop between the negative electrode of the first battery cell $M_i$ and the negative electrode of the second battery cell $M_{i+1}$ and calculating the resistance $R_i$ of the connecting wire, the determining module 613 can check whether the new resistance $R_s$ appears, and accordingly determine whether the connection of the first battery cell $M_i$ is abnormal.

In one example, the determining module 613 may determine whether the resistance $R_i$ of the connecting wire is greater than a first predetermined threshold $R_{TH1}$. If the resistance $R_i$ is greater than the first predetermined threshold $R_{TH1}$, the determining module 613 can determine that the connector 605 between $M_i$ and $M_{i+1}$ is loose. The first predetermined threshold $R_{TH1}$ can be a resistance of a connecting wire of a battery cell with a normally connected connector. Alternatively, the first predetermined threshold $R_{TH1}$ can be an average of resistances of connecting wires of multiple battery cells coupled in series with normally connected connectors.

In another example, the determining module 613 may calculate a difference between the resistance $R_i$ and a resistance $R_j$ of another connecting wire. If the difference between the resistance $R_i$ and the resistance $R_j$ is greater than a second predetermined threshold $R_{TH2}$, the determining module 613 may determine the connector 605 between $M_i$ and $M_{i+1}$ is loose. The second predetermined threshold $R_{TH2}$ can be a resistance of a connecting wire of a battery cell with a normal connected connector or can be an average of resistances of connecting wires of multiple battery cells coupled in series with normal connected connectors. For example, if the resistance $R_i$ is greater than the resistance $R_j$, the determining module 613 can determine that the first battery cell $M_i$ is abnormal.

In addition, the determining module 613 may determine whether a connection of a battery cell $M_n$ is abnormal by detecting voltage drop between a negative electrode of the battery pack $M_n$ and a positive electrode P+ of the battery pack.

The abnormality detecting device 610 can further include a current detecting module (not shown in FIG. 6) and a control module (not shown in FIG. 6). The current detecting module may be configured for detecting the current I flowing through the battery pack B1 during the discharging period or the charging period. The control module may be configured for controlling a charger to provide the current I for charging the battery pack B1.

In one embodiment, the abnormality detecting device 610 can further include a request module (not shown in FIG. 6). At the beginning of the charging period or the discharging period, the request module may send out a request to the abnormality detecting device 610 to detect the current flowing through the battery pack B1 and/or to the control module to control the charger to supply a charging current to the battery pack B1.

The abnormality detecting device 610 may further include a warning module (not shown in FIG. 6). The warning module may generate a warning signal if the determining module 613 determines that the connection between $M_i$ and $M_{i+1}$ is abnormal.

In addition, compared with FIG. 4, the BMS 600 in FIG. 6 may utilize less detecting wires to detect abnormality of each battery cell, and can further identify which battery cell has an abnormal connection. Therefore, the cost is reduced and the detecting accuracy is improved.

Figure 7:
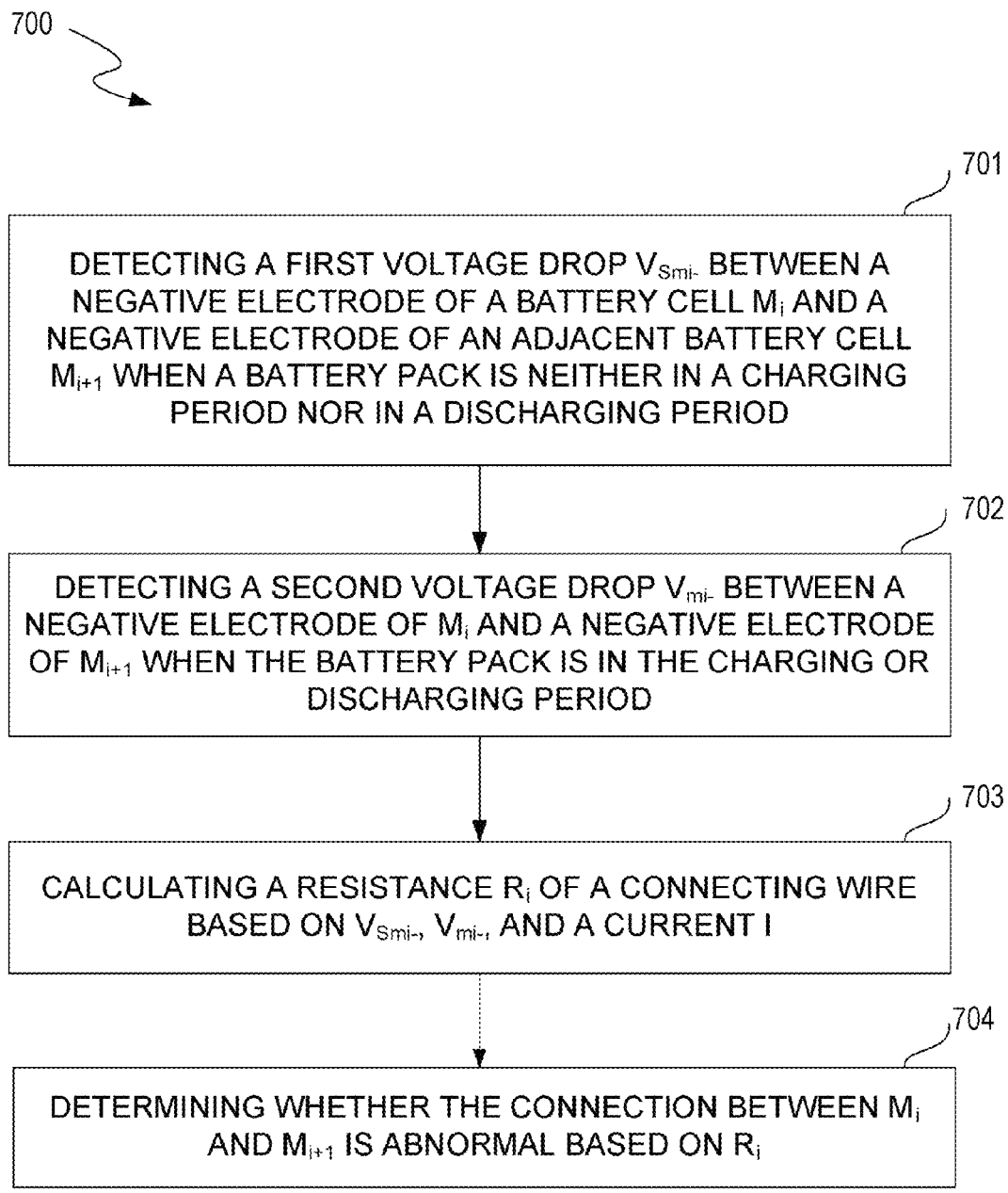
FIG. 7 is a flowchart illustrating an exemplary embodiment of a method for detecting abnormality of a battery pack, in according with another embodiment of the present teaching.

FIG. 7 is a flowchart 700 illustrating a method for detecting abnormality of a battery pack, in according with another embodiment of the present teaching. The method may be implemented on a machine having at least one processor, storage, and a communication platform. For example, FIG. 7 may be described in conjunction with FIG. 6 for detecting abnormality of the battery pack B1.

At 701, a first voltage drop $V_{Smi-}$ between a negative electrode of a first battery cell $M_i$ ($1 \leq i \leq n$) and a corresponding negative electrode of a second battery cell $M_{i+1}$ in the battery pack B1 may be detected. As described above, 701 may be performed by the voltage detecting module 611 when the battery pack B1 is neither in a charging or discharging period. The second battery cell $M_{i+1}$ may be an adjacent battery cell of the first battery cell $M_i$.

At 702, a second voltage drop $V_{mi-}$ between the negative electrode of the first battery cell $M_i$ and the corresponding negative electrode of the second battery cell $M_{i+1}$ may be detected. As described above, 702 may be performed by the voltage detecting module 611 during the charging or discharging period of the battery pack B1.

At 703, a resistance $R_i$ of a connecting wire between $M_i$ and $M_{i-1}$ may be calculated, based on the first voltage drop $V_{Smi-}$, the second voltage drop $V_{mi-}$ and a current I flowing through the battery pack B1 which has been measured during a charging or discharging period. As described above, 703 may be performed by the computing module 612.

At 704, whether the connection between the first battery cell $M_i$ and the second battery cell $M_{i+1}$ is abnormal may be determined based on the resistance $R_i$ of the connecting wire. As described above, 704 may be performed by the determining module 613. For example, the determining module 613 may compare the resistance $R_i$ of the connecting wire with a first predetermined threshold $R_{TH1}$. If the resistance of the connecting wire is greater than the first predetermined threshold $R_{TH1}$, the determining module 613 may determine the connector 605 between $M_i$ and $M_{i+1}$ is loose. Alternatively, the determining module 613 may calculate a difference between the resistance $R_i$ of the connecting wire and a resistance $R_j$ of another connecting wire. If the difference between the resistance $R_i$ and the resistance $R_j$ is greater than a second predetermined threshold $R_{TH2}$, the determining module 613 may determine the connector 605 between $M_i$ and $M_{i+1}$ is loose.

Figure 8:
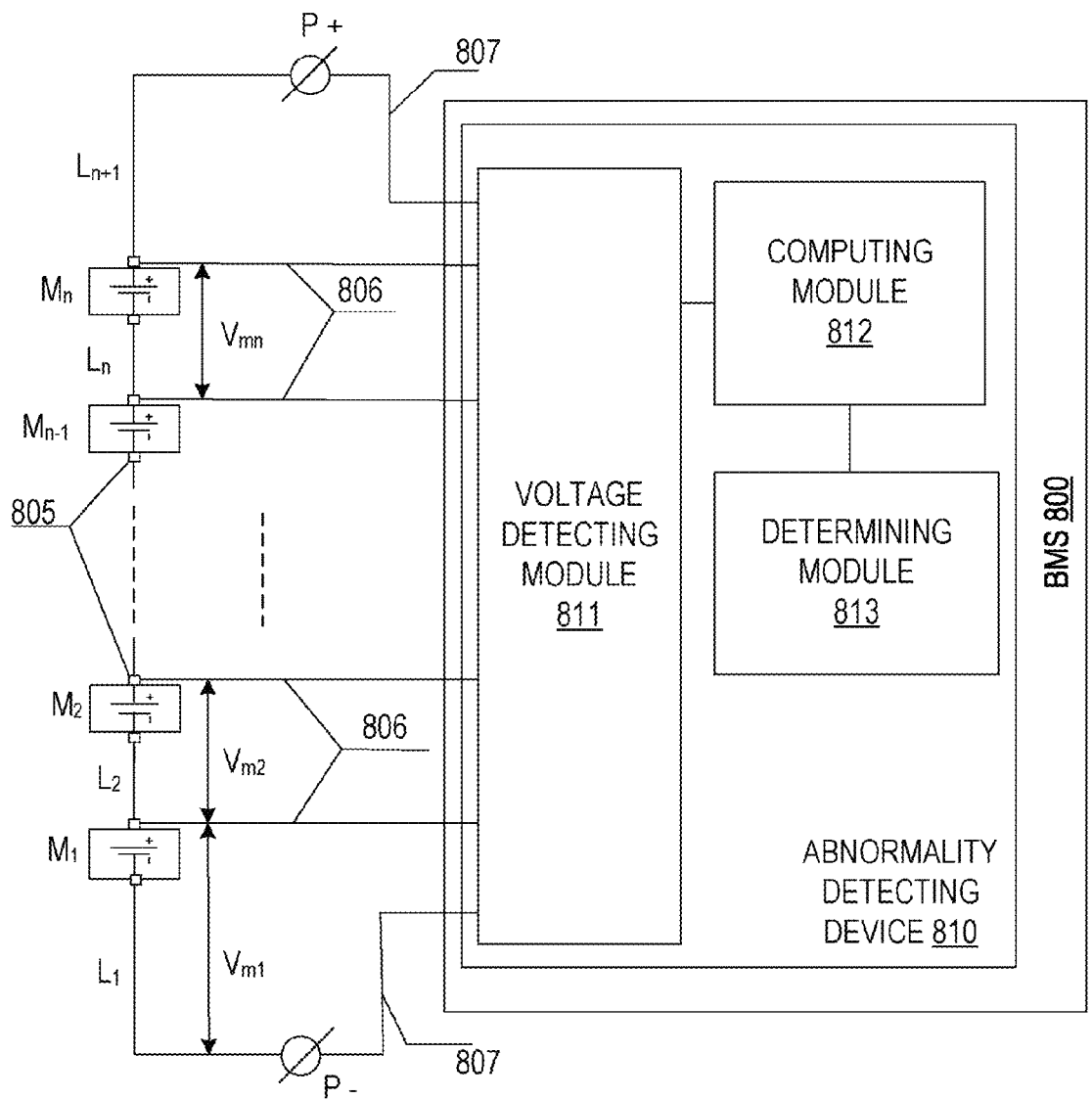
FIG. 8 is a block diagram illustrating an exemplary BMS, in accordance with still another embodiment of the present teaching.

FIG. 8 is a block diagram illustrating an exemplary BMS 800, in accordance with yet another embodiment of the present teaching.

The BMS 800 may include the battery pack B1 in the FIG. 1 and an abnormality detecting device 810. The abnormality detecting device 810 may includes a voltage detecting module 811, a computing module 812 and a determining module 813. The apparatus 810 may have at least one processor, storage, and a communication platform. The modules 811, 812, and 813 may all be implemented on the processor. The storage may store thresholds for detecting abnormality of the battery pack. The system 800 may communicate with other systems in e.g., an electric vehicle, via the communication platform.

The voltage detecting module 811 may be coupled to the positive electrode P+ and the negative electrode P− of the battery pack B1 through two detecting wires 807 respectively. The voltage detecting 801 may be coupled to each positive electrode of the battery cells $M_1, M_2 \ldots M_n$ through n detecting wires 806. The voltage detecting module 811 may be configured for detecting a first voltage drop $V_{Smi+}$ between a positive electrode of a first battery cell $M_i$ ($1 \leq i \leq n$) in the battery pack B1 and a corresponding positive electrode of a second battery cell $M_{i-1}$ in the battery pack B1 when the battery pack B1 is neither in a charging period nor in a discharging period. The second battery cell $M_{i-1}$ is an adjacent battery cell of the first battery cell $M_i$. The voltage detecting module 811 may be further configured for detecting a second voltage drop $V_{mi+}$ between the positive electrode of the first battery cell $M_i$ and the corresponding positive electrode of the second battery cell $M_{i-1}$ during the charging period or the discharging period of the battery pack B1.

The second voltage drop $V_{mi+}$ may be an average value of voltage drops from a beginning of the charging or discharging period to a certain time with a current I flowing through the battery pack B1. Alternatively, the second voltage drop $V_{mi+}$ can be an instantaneous value within a predetermined time period. As an example, the predetermined time period can be 3 s~6 s or 1 s~5 s.

The computing module 812 may be configured for calculating a resistance $R_i$ of a connecting wire between the first battery cell $M_i$ and the second battery cell $M_{i-1}$ based on the first voltage drop $V_{Smi+}$, the second voltage drop $V_{mi+}$ and a current I using equation (16) represented as:

$$R_i = |V_{mi+} - V_{Smi+}|/I \quad (16)$$

The current I may be greater than 5 A for electric bicycles, and may be greater than 20 A for electric vehicles.

The determining module 813 may be configured for determining whether the connection between $M_i$ and $M_{i-1}$ is abnormal based on the resistance $R_i$ of the connecting wire.

In one example, the determining module 813 may determine whether the resistance $R_i$ of the connecting wire is greater than a first predetermined threshold $R_{TH1}$. If the resistance $R_i$ is greater than the first predetermined threshold $R_{TH1}$, the determining module 813 may determine that the connector 805 between $M_i$ and $M_{i-1}$ is loose. The first predetermined threshold $R_{TH1}$ can be a resistance of a connecting wire of a battery cell with a normally connected connector. Alternatively, the first predetermined threshold $R_{TH1}$ can be an average of resistances of connecting wires of multiple battery cells coupled in series with normally connected connectors.

In another example, the determining module 813 may calculate a difference between the resistance $R_i$ and a resistance $R_j$ of another connecting wire. If the difference between the resistance $R_i$ and the resistance $R_j$ is greater than a second predetermined threshold $R_{TH2}$, the determining module 813 may determine the connector 805 between $M_i$ and $M_{i-1}$ is loose. The second predetermined threshold $R_{TH2}$ can be a resistance of a connecting wire of a battery cell with a normal connected connector or can be an average of resistances of connecting wires of multiple battery cells coupled in series with normal connected connectors. For example, if the resistance $R_i$ is greater than the resistance $R_j$, the determining module 813 may determine that the connection between $M_i$ and $M_{i-1}$ is abnormal.

In addition, the determining module 813 may determine whether a connection of a battery cell $M_1$ is abnormal by detecting voltage drop between a positive electrode of the battery pack $M_1$ and a negative electrode P− of the battery pack.

The abnormality detecting device 810 can further include a current detecting module (not shown in FIG. 8) and a control module (not shown in FIG. 8). The current detecting module may be configured for detecting the current I flowing through the battery pack B1 during the discharging period or the charging period. The control module may be configured for controlling a charger to supply the current I for charging the battery pack B1.

The abnormality detecting device 810 may further include a warning module (not shown in FIG. 8). The warning module may generate a warning signal when the determining module 813 determines that the connection between $M_i$ and $M_{i-1}$ is abnormal.

Figure 9:
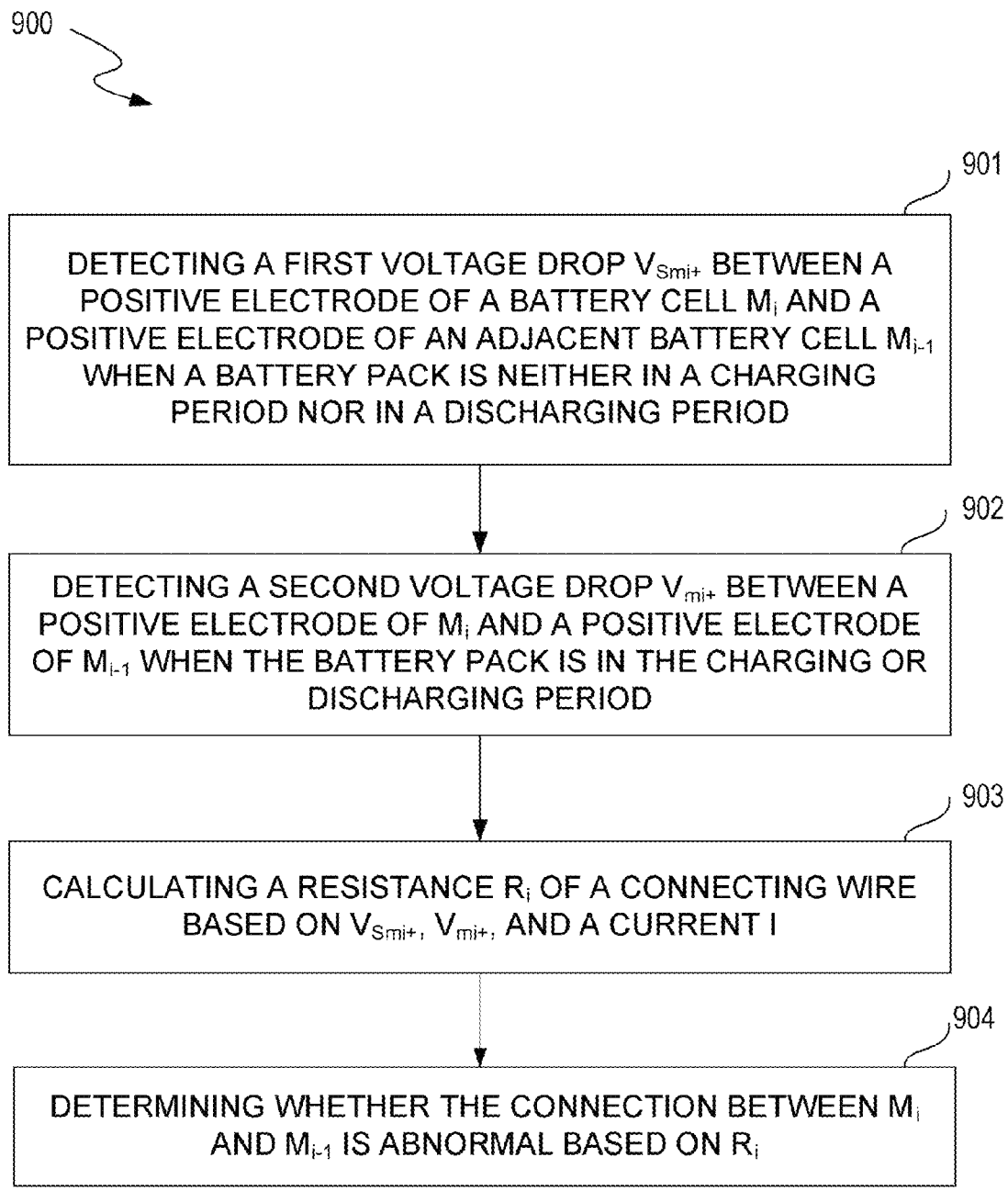
FIG. 9 is a flowchart illustrating an exemplary embodiment of a method for detecting abnormality of a battery pack, in according with still another embodiment of the present teaching.

FIG. 9 is a flowchart 900 illustrating a method for detecting abnormality of a battery pack, in according with yet another embodiment of the present teaching. The method may be implemented on a machine having at least one processor, storage, and a communication platform. For example, FIG. 9 may be described in conjunction with FIG. 8 for detecting abnormality of the battery pack B1.

At 901, a first voltage drop $V_{Smi+}$ between a positive electrode of a first battery cell $M_i$ and a corresponding positive electrode of an second battery cell $M_{i-1}$ may be detected, $1 \leq i \leq n$. This may be performed by the voltage detecting module 811 when the battery pack B1 is neither in a charging period nor a discharging period. The second battery cell $M_{i-1}$ is an adjacent battery cell of the first battery cell $M_i$.

At 902, a second voltage drop $V_{mi+}$ between the positive electrode of the first battery cell $M_i$ and the corresponding positive electrode of the second battery cell $M_{i-1}$ may be detected. This may be performed by the voltage detecting module 811 during the charging or discharging period of the battery pack B1. The second voltage drop $V_{mi+}$ may be detected within a time period from a beginning of the charging period or discharging period to a predetermined time with a current I flowing through the battery pack B1 which is measured during a charging period or a discharging period.

At 903, a resistance $R_i$ of a connecting wire between the first battery cell $M_i$ and the second battery cell $M_{i-1}$ may be calculated based on the first voltage drop $V_{Smi+}$, the second voltage drop $V_{mi+}$ and the current I. This may be performed by the computing module 812. A current detecting module may detect the current I at the beginning of the charging period or discharging period. A control module may control a charger to supply the current I to charge the battery pack B1.

At 904, whether connector 805 between the first battery cell $M_i$ and the second battery cell $M_{i-1}$ is loose may be determined based on the resistance $R_i$ of the connecting wire. This may be performed by the determining module 813. For example, the determining module 813 may compare the resistance $R_i$ of the connecting wire with a predetermined threshold $R_{TH1}$. If the resistance of the connecting wire is greater than the predetermined threshold $R_{TH1}$, the determining module 813 may determine the connector 805 between the first battery cell $M_i$ and the second battery cell $M_{i-1}$ is loose. Alternatively, the determining module 813 may calculate a difference between the resistance $R_i$ of the connecting wire and a resistance $R_j$ of another connecting wire. If the difference between the resistance $R_i$ and the resistance $R_j$ is greater than a second predetermined threshold $R_{TH2}$, the determining module 813 may determine the connector 805 between $M_i$ and $M_{i-1}$ is loose.

Figure 10:
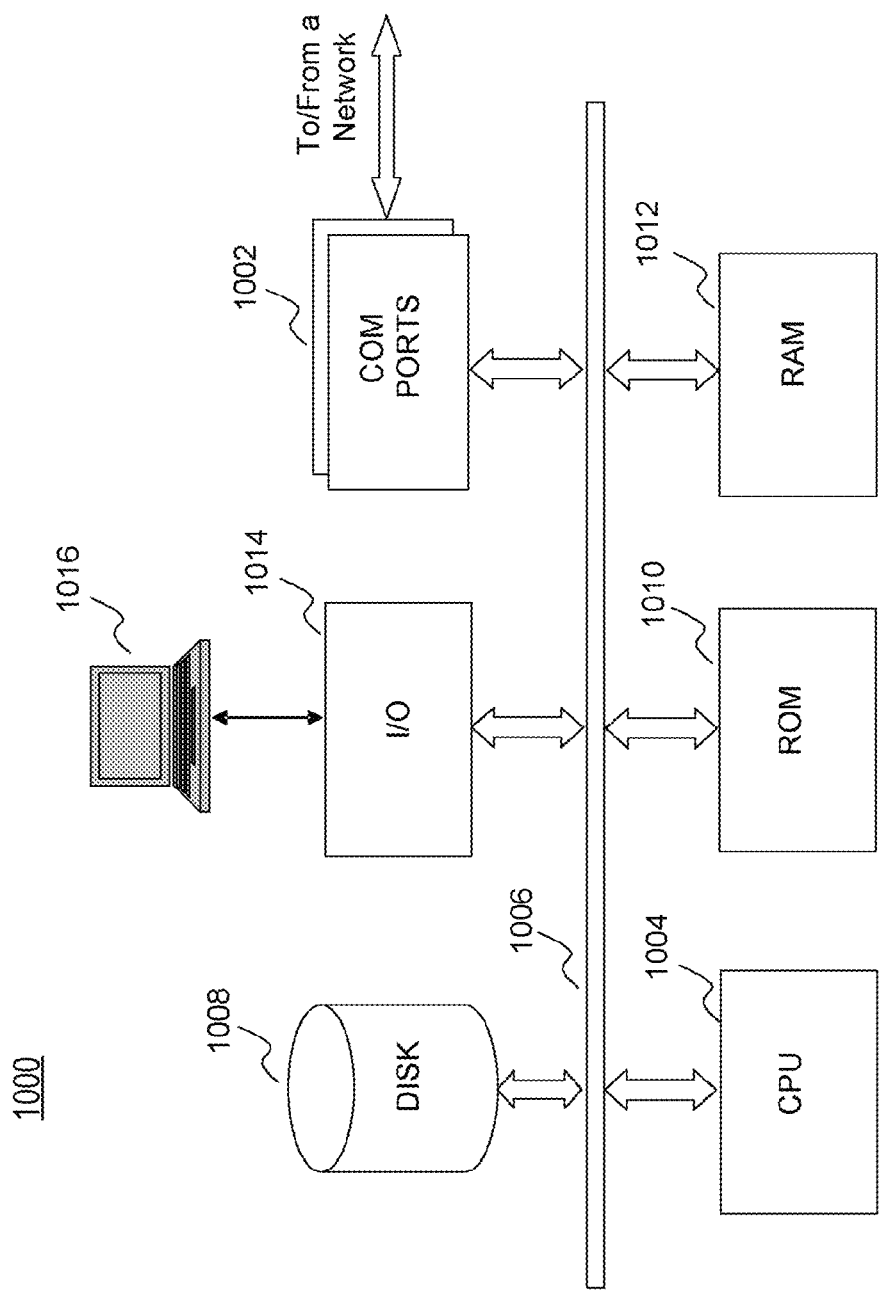
FIG. 10 depicts a general computer architecture on which the present teaching can be implemented.

FIG. 10 depicts a general computer architecture on which the present teaching can be implemented and has a functional block diagram illustration of a computer hardware platform that includes user interface elements. The computer may be a general-purpose computer or a special purpose computer. This computer 1000 can be used to implement any components of the system as described herein for detecting abnormality of a battery pack. Different components of the systems 400, 600, 800 as depicted in FIGS. 4, 6, 8, can all be implemented on one or more computers such as computer 1000, via its hardware, software program, firmware, or a combination thereof. Although only one such computer is shown, for convenience, the computer functions relating to dynamic relation and event detection may be implemented in a distributed fashion on a number of similar platforms, to distribute the processing load.

The computer 1000, for example, includes COM ports 1002 connected to and from a network connected thereto to facilitate data communications. The computer 1000 also includes a central processing unit (CPU) 1004, in the form of one or more processors, for executing program instructions. The exemplary computer platform includes an internal communication bus 1006, program storage and data storage of different forms, e.g., disk 1008, read only memory (ROM) 1010, or random access memory (RAM) 1012, for various data files to be processed and/or communicated by the computer, as well as possibly program instructions to be executed by the CPU. The computer 1000 also includes an I/O component 1014, supporting input/output flows between the computer and other components therein such as user interface elements 1016. The computer 1000 may also receive programming and data via network communications.

Hence, aspects of the method for detecting battery abnormality and cause thereof, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another. Thus, another type of media that may bear the software elements includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Those skilled in the art will recognize that the embodiments of the present teaching are amenable to a variety of modifications an/or enhancements. For example, although the implementation of various components described above may be embodied in a hardware device, it can also be implemented as a software only solution—e.g., an installation on an existing server. In addition, the dynamic relation/event detector and its components as disclosed herein can be implemented as firmware, a firmware/software combination, a firmware/hardware combination, or a hardware/firmware/software combination.

While the foregoing description and drawings represent embodiments of the present teaching, it will be understood that various additions, modifications and substitutions may be made therein without departing from the spirit and scope of the principles of the present teaching as defined in the accompanying claims. One skilled in the art will appreciate that the teaching may be used with many modifications of form, structure, arrangement, proportions, materials, elements, and components and otherwise, used in the practice of the teaching, which are particularly adapted to specific environments and operative requirements without departing from the principles of the present teaching. The presently disclosed embodiments are therefore to be considered in all respects as illustrative and not restrictive, the scope of the teaching being indicated by the appended claims and their legal equivalents, and not limited to the foregoing description.

We claim:

1. A method, implemented on a machine having at least one processor, storage, and a communication platform for detecting abnormality of a battery pack having a plurality of battery cells coupled in series via at least one connecting wire, comprising:
    detecting a first voltage drop between a positive electrode and a negative electrode of the battery pack and a first set of voltage drops between a positive electrode and a negative electrode of each battery cell in the battery pack;
    calculating a total voltage drop across the at least one connecting wire in the battery pack based on an absolute difference between the first voltage drop and a sum of the first set of voltage drops;
    determining whether the battery pack is abnormal by assessing the total voltage drop across the at least one connecting wire with respect to a predetermined threshold;

detecting a second voltage drop between the positive electrode and the negative electrode of the battery pack and a second set of voltage drops between the positive electrode and the negative electrode of each battery cell in the battery pack when the battery pack is neither in a charging period nor in a discharging period;

calculating a detecting error based on an absolute difference between the second voltage drop and a sum of the second set of voltage drops;

setting the predetermined threshold with a first threshold value which is greater than the detecting error;

updating the predetermined threshold of the first threshold value to an updated predetermined threshold of a second threshold value which is greater than 1.5 times of the absolute difference between the first voltage drop and the sum of the first set of voltage drops, if the battery pack is determined to be normal based on the predetermined threshold of the first threshold value;

measuring a current flowing through the battery pack; and establishing a relationship between the updated predetermined threshold and the current flowing through the battery pack.

2. The method of claim 1, wherein the predetermined threshold is greater than ten times of the detecting error.

3. A method, implemented on a machine having at least one processor, storage, and a communication platform for detecting abnormality of a battery pack having a plurality of battery cells coupled in series via at least one connecting wire, comprising:

detecting a first voltage drop between an electrode of a first battery cell and a corresponding electrode of a second battery cell when the battery pack is neither in a charging period nor in a discharging period, wherein the first battery cell and the second battery cell are adjacent to each other in the battery pack;

detecting a second voltage drop between the electrode of the first battery cell and the corresponding electrode of the second battery cell during the charging period or the discharging period of the battery pack;

calculating a first resistance of a connecting wire connecting the first battery cell and the second battery cell based on the first voltage drop, the second voltage drop and a current flowing through the battery pack during the charging or discharging period; and determining whether the connection between the first and second battery cells is abnormal based on the first resistance of the connecting wire.

4. The method of claim 3, wherein calculating a first resistance of a connecting wire connecting the first battery cell and the second battery cell further comprises:

calculating an absolute difference between the first voltage drop and the second voltage drop; and dividing the absolute difference by the current flowing through the battery pack to calculate the first resistance of the connecting wire.

5. The method of claim 3, wherein determining whether the connection between the first and second battery cells is abnormal further comprises:

assessing the first resistance of the connecting wire with respect to a first predetermined threshold; and determining the connection between the first and second battery cells is abnormal if the first resistance of the connecting wire is greater than the first predetermined threshold.

6. The method of claim 3, wherein determining whether the connection between the first and second battery cells is abnormal further comprises:

calculating a second resistance of another connecting wire in the battery pack;

calculating a difference between the first and second resistances;

assessing the difference with respect to a second predetermined threshold; and determining the connection between the first and second battery cells is abnormal if the difference is greater than the second predetermined threshold.

7. The method of claim 3, wherein the second voltage drop is detected within a predetermined time period which starts from a beginning of the charging or discharging period.

8. The method of claim 7, further comprising:

detecting the current flowing through the battery pack at the beginning of the charging or discharging period.

9. The method of claim 3, further comprising:

controlling a charger to provide the current for charging the battery pack.

10. An apparatus having at least one processor, storage, and a communication platform for detecting abnormality of a battery pack having a plurality of battery cells coupled in series via at least one connecting wire, comprising:

a voltage detecting module implemented on the processor and configured for detecting a first voltage drop between an electrode of a first battery cell and a corresponding electrode of a second battery cell when the battery pack is neither in a charging period nor in a discharging period, and for detecting a second voltage drop between the electrode of the first battery cell and the corresponding electrode of the second battery cell during the charging or discharging period of the battery pack, wherein the first battery cell and the second battery cell are adjacent to each other in the battery pack, a computing module implemented on the processor and configured for calculating a first resistance of a connecting wire connecting the first battery cell and the second battery cell based on the first voltage drop, the second voltage drop and a current flowing through the battery pack during the charging or discharging period; and a determining module implemented on the processor and configured for determining whether the connection between the first and second battery cells is abnormal based on the first resistance of the connecting wire.

11. The apparatus of claim 10, wherein the computing module is further configured for:

calculating an absolute difference between the first voltage drop and the second voltage drop; and dividing the absolute difference by the current flowing through the battery pack to calculate the first resistance of the connecting wire.

12. The apparatus of claim 10, further comprising:

a current detecting module implemented on the processor and configured for detecting the current flowing through the battery pack.

13. The apparatus of claim 10, further comprising:

a control module implemented on the processor and configured for controlling a charger to provide the current for charging the battery pack.

* * * * *